United States Patent
Choi et al.

(10) Patent No.: US 9,806,282 B2
(45) Date of Patent: Oct. 31, 2017

(54) ORGANIC LIGHT-EMITTING DIODE AND MANUFACTURING METHOD THEREFOR

(71) Applicant: LG Display Co., Ltd., Seoul (KR)

(72) Inventors: Junrye Choi, Daejeon (KR); Jung Hyoung Lee, Daejeon (KR); Jihee Kim, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/787,687

(22) PCT Filed: May 30, 2014

(86) PCT No.: PCT/KR2014/004867
§ 371 (c)(1),
(2) Date: Oct. 28, 2015

(87) PCT Pub. No.: WO2014/193196
PCT Pub. Date: Dec. 4, 2014

(65) Prior Publication Data
US 2016/0087240 A1    Mar. 24, 2016

(30) Foreign Application Priority Data

May 31, 2013  (KR) ........................ 10-2013-0062366

(51) Int. Cl.
| | | |
|---|---|---|
| *H01L 51/52* | (2006.01) |
| *H01L 51/00* | (2006.01) |
| *H01L 27/32* | (2006.01) |
| *H05K 1/03* | (2006.01) |
| *H05K 1/02* | (2006.01) |
| *H05H 1/18* | (2006.01) |
| *H05K 1/09* | (2006.01) |
| *H01L 51/56* | (2006.01) |
| *H05K 1/18* | (2006.01) |

(52) U.S. Cl.
CPC ...... *H01L 51/5246* (2013.01); *H01L 27/3276* (2013.01); *H01L 51/0024* (2013.01); *H01L 51/0097* (2013.01); *H01L 51/5203* (2013.01); *H01L 51/524* (2013.01); *H01L 51/5259* (2013.01); *H01L 51/56* (2013.01); *H05K 1/028* (2013.01); *H05K 1/0298* (2013.01); *H05K 1/0346* (2013.01); *H05K 1/09* (2013.01); *H05K 1/181* (2013.01); *H01L 2227/323* (2013.01); *H01L 2251/5338* (2013.01); *H01L 2251/558* (2013.01); *H05K 2201/10106* (2013.01)

(58) Field of Classification Search
None
See application file for complete search history.

(56) References Cited

U.S. PATENT DOCUMENTS

| 5,990,615 A | 11/1999 | Sakaguchi et al. |
| 6,936,131 B2 * | 8/2005 | McCormick ........ H01L 51/5237 156/292 |
| 2004/0061136 A1 | 4/2004 | Tyan |

(Continued)

FOREIGN PATENT DOCUMENTS

| CN | 102544060 A | 7/2012 |
| CN | 103081157 A | 5/2013 |

(Continued)

*Primary Examiner* — Joseph Schoenholtz
(74) *Attorney, Agent, or Firm* — Dentons US LLP

(57) ABSTRACT

Provided are an organic light emitting diode and a method for preparing the same.

41 Claims, 2 Drawing Sheets

(56) References Cited

U.S. PATENT DOCUMENTS

| | | |
|---|---|---|
| 2006/0186802 A1 | 8/2006 | Cok et al. |
| 2006/0207649 A1 | 9/2006 | Nabeta |
| 2007/0000687 A1* | 1/2007 | Brist ................ H01P 3/084 174/255 |
| 2007/0096631 A1* | 5/2007 | Sung ................ G02F 1/1339 313/498 |
| 2008/0029869 A1 | 2/2008 | Kwon et al. |
| 2009/0039780 A1 | 2/2009 | Kim et al. |
| 2011/0089819 A1 | 4/2011 | Mo et al. |
| 2011/0133213 A1 | 6/2011 | Lee et al. |
| 2011/0156084 A1* | 6/2011 | Choi ................ H01L 51/5203 257/99 |
| 2012/0018729 A1 | 1/2012 | Takayama et al. |
| 2012/0133278 A1 | 5/2012 | Ryu |
| 2012/0146061 A1* | 6/2012 | Nam ................ H01L 27/3276 257/88 |
| 2012/0153814 A1 | 6/2012 | Lee et al. |
| 2013/0020935 A1 | 1/2013 | Ohazama |
| 2013/0207093 A1 | 8/2013 | Jeong et al. |
| 2017/0092663 A1* | 3/2017 | Chung ................ H01L 27/1244 |

FOREIGN PATENT DOCUMENTS

| | | |
|---|---|---|
| JP | 2003109747 A | 4/2003 |
| JP | 2008-010211 A | 1/2008 |
| JP | 2011-192567 A | 9/2011 |
| KR | 1998-0071030 A | 10/1998 |
| KR | 10-2008-0011919 A | 2/2008 |
| KR | 10-2009-0015293 A | 2/2009 |
| KR | 10-2011-0064670 A | 6/2011 |
| KR | 10-2011-0075684 A | 7/2011 |
| KR | 10-2012-0004943 A | 1/2012 |
| KR | 10-2012-0110638 A | 10/2012 |
| TW | 1301388 | 9/2008 |
| WO | 2011/136262 A1 | 11/2011 |
| WO | 2012/134028 A1 | 10/2012 |

* cited by examiner

[Figure 1]
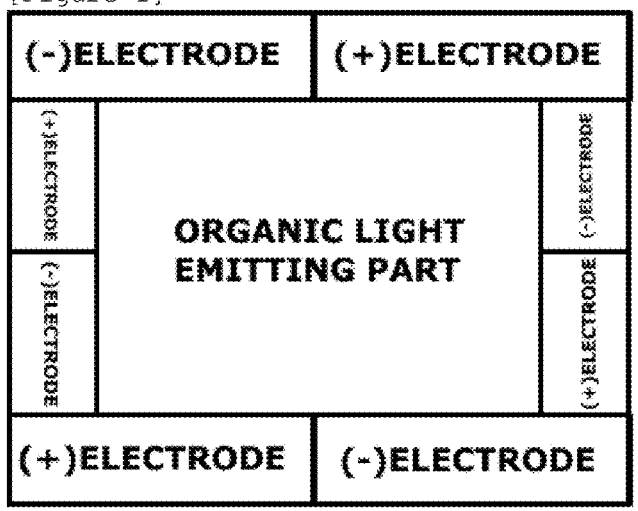
[Figure 2]
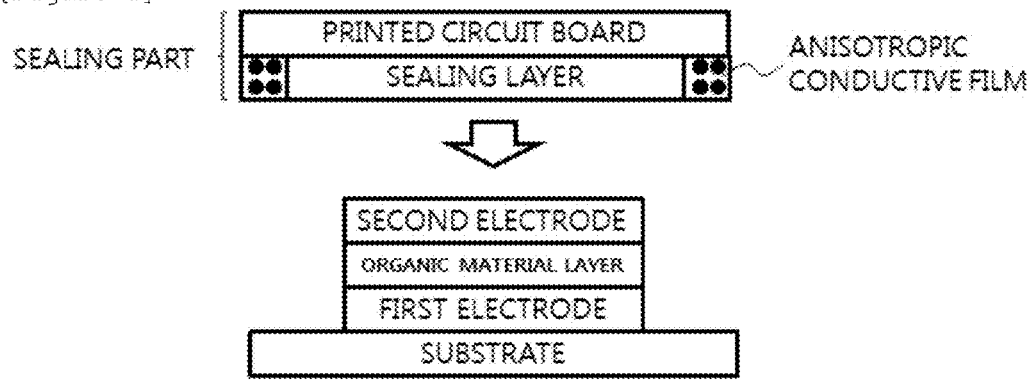

[Figure 3]
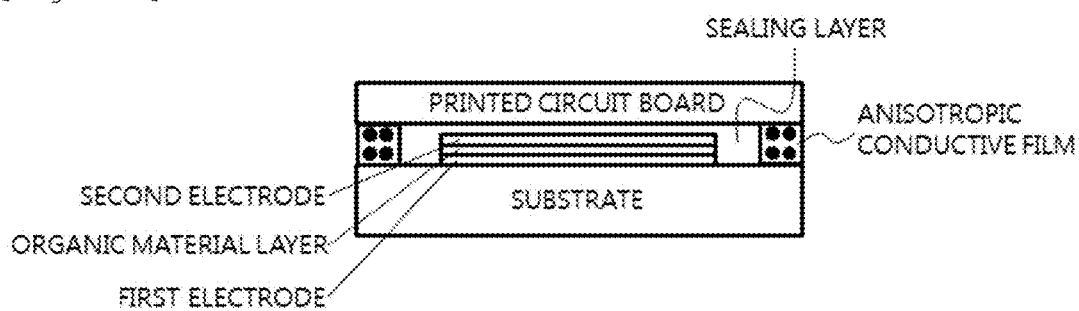
[Figure 4]
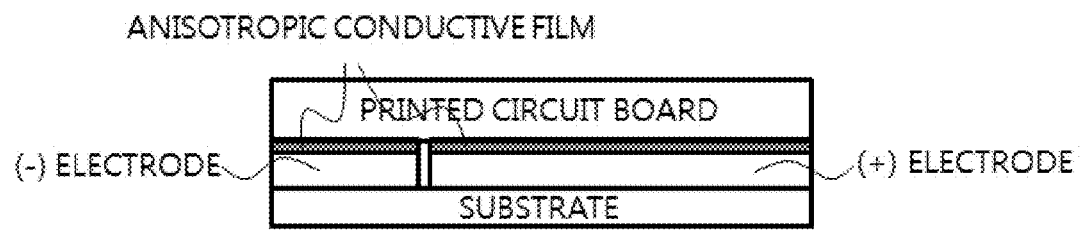

ORGANIC LIGHT-EMITTING DIODE AND MANUFACTURING METHOD THEREFOR

TECHNICAL FIELD

This application is a National Stage Entry of International Application No. PCT/KR2014/004867, filed May 30, 2014, and claims the benefit of Korean Application No. 10-2013-0062366 filed on May 31, 2013, all of which are hereby incorporated by reference in their entirety for all purposes as if fully set forth herein.

The present invention relates to an organic light emitting diode and a method for preparing the same.

BACKGROUND ART

An organic light emitting diode includes organic light emitting diodes configured by a hole injection electrode, an organic light emitting layer, and an electron injection electrode. Each organic light emitting diode emits light by energy generated when excitons generated when electrons and holes are coupled with each other in the organic light emitting layer fall down from an excited state to a ground state, and the organic light emitting diode displays a predetermined image by using the light emission.

Since the organic light emitting diode has a self-luminance characteristic and does not require a separate light source unlike a liquid crystal display device, a thickness and a weight thereof may be reduced. Further, since the organic light emitting diode has high-grade characteristics such as low power consumption, high luminance, and a high response speed, the organic light emitting diode has received attention as a next-generation display device.

The aforementioned organic light emitting diode may be deteriorated due to internal factors such as deterioration of the organic light emitting layer by oxygen from indium tin oxide (ITO) used as an electrode material and deterioration due to reaction between interfaces of organic material layers configuring the organic light emitting layer, and may be deteriorated due to external factors such as external moisture and oxygen or ultraviolet rays. Particularly, since the external oxygen and moisture has a pernicious effect on a lifespan of the organic light emitting diode, a packing technology that seals the organic light emitting diode is very important.

DISCLOSURE

Technical Problem

The present invention relates to an organic light emitting diode in which an organic light emitting part is sealed and a method for preparing the same.

Technical Solution

An exemplary embodiment of the present invention provides an organic light emitting diode including: a substrate; an organic light emitting part in which a first electrode, an organic material layer, and a second electrode are sequentially laminated on the substrate; and a sealing part covering an outside of the organic light emitting part of the substrate, in which the sealing part includes a printed circuit board including a base and a metal pattern formed at an edge of one side of the base, and a sealing layer filling a space between the printed circuit board and the outside of the organic emitting part.

Further, another exemplary embodiment of the present invention provides a display device including the organic light emitting diode.

Further, yet another exemplary embodiment of the present invention provides an illumination device including the organic light emitting diode.

Further, still another exemplary embodiment of the present invention provides a method for preparing an organic light emitting diode including: forming an organic emitting part by sequentially laminating a first electrode, an organic material layer, and a second electrode on a substrate; and installing a sealing part covering the outside of the organic emitting part of the substrate, in which the sealing part includes a printed circuit board including a base and a metal pattern formed at an edge of one side of the base, and a sealing layer filling a space between the printed circuit board and the outside of the organic emitting part.

Further, still yet another exemplary embodiment of the present invention provides a structure of a printed circuit board including: a base; a metal pattern provided at an edge of one side of the base; and a sealing layer provided on the other side of the base.

Advantageous Effects

According to the exemplary embodiment of the present invention, it is possible to simplify a structure for sealing of an organic light emitting part and an equipotential of the electrode, by using a printed circuit board as a sealant sealing the organic light emitting part.

According to the exemplary embodiment of the present invention, it is possible to reduce a process for sealing of an organic light emitting part and an equipotential of the electrode, by using a printed circuit board as a sealant sealing the organic light emitting part.

DESCRIPTION OF DRAWINGS

FIG. 1 is a front view of an organic light emitting diode in which an organic light emitting part is formed on a substrate according to an exemplary embodiment of the present invention.

FIG. 2 illustrates a diagram of applying a flexible printed circuit board to the organic light emitting part of the organic light emitting diode according to the exemplary embodiment of the present invention.

FIG. 3 is a schematic diagram of the organic light emitting diode according to the exemplary embodiment of the present invention.

FIG. 4 is a side view of the organic light emitting diode according to the exemplary embodiment of the present invention.

MODE FOR INVENTION

Hereinafter, exemplary embodiments of the present invention will be described in detail.

The present invention includes a substrate; an organic light emitting part in which a first substrate, an organic material layer, and a second electrode are sequentially laminated on the substrate; and a sealing part covering an outside of the organic light emitting part of the substrate.

The material and the size of the substrate are not particularly limited so long as the organic light emitting part may be laminated and sealed.

For example, the substrate may be a transparent substrate, and in detail, may be a glass substrate or a plastic substrate.

A material of the plastic substrate is not particularly limited, and may be rigid plastic which is a rigid material or flexible plastic which is a soft material.

For example, as the material of the plastic substrate, films such as polyethylene terephthalate (PET), poly(ethylene naphthalate) (PEN), and polyimide (PI) may be used in a form of a single layer or a multilayer.

The organic light emitting part includes a first electrode, an organic material layer, and a second electrode which are sequentially laminated on the substrate, and means a portion of displaying an image. Further, a portion except for the organic light emitting part of the substrate is called a non-organic light emitting part.

The first electrode may be a positive electrode or a negative electrode, and the second electrode which is opposite to the first electrode may be a positive electrode or a negative electrode. That is, when the first electrode is a positive electrode, the second electrode may be a negative electrode, and when the first electrode is a negative electrode, the second electrode may be a positive electrode.

The organic material layer is a layer which is made of an organic material to convert electric energy into light energy, and when a voltage is applied between the two electrodes, holes are injected into the organic material layer in the positive electrode and electrons are injected into the organic material layer in the negative electrode.

In addition, when the injected holes and electrons meet each other, excitons are formed, and when the excitons fall down to a ground state again, light is emitted.

The organic material layer may be formed as a multilayered structure configured by different materials in order to increase efficiency and stability of an organic electronic device, and for example, may be configured by an hole injection layer, a hole transport layer, an light emitting layer, an electron transport layer, an electron injection layer, and the like.

Materials of the positive electrode, the negative electrode, and the organic material layer are not particularly limited so long as the materials may function as the positive electrode, the negative electrode, and the organic material layer, respectively, and may use materials which are generally used in the art.

In the exemplary embodiment of the present invention, the sealing part includes a printed circuit board including a base and a metal pattern formed at an edge of one side of the base, and a sealing layer filling a space between the printed circuit board and the outside of the organic light emitting part.

The base may be a glass substrate or a plastic substrate. A material of the plastic substrate is not particularly limited, and may be rigid plastic which is a rigid material or flexible plastic which is a soft material.

For example, the material of the plastic substrate may use a film of PET, PEN, PI, and the like as a single layer or a multilayer.

In this specification, the outside of the organic light emitting part means all the surfaces of the organic light emitting part except for a surface contacting the substrate, that is, means a side surface and an upper surface which do not contact the substrate.

In the exemplary embodiment of this specification, the printed circuit board may be a flexible printed circuit board.

In the exemplary embodiment of this specification, the printed circuit board may include at least one metal pattern.

In the exemplary embodiment of this specification, the printed circuit board may include one or more insulating layers included in at least one of between the base and the metal pattern, and on the metal pattern.

In the exemplary embodiment of this specification, in the case where the metal patterns are two or more, the printed circuit board may include an insulating layer included in at least one of between the base and the metal pattern, between the two or more metal patterns, and on the metal pattern.

Here, the upper portion of the metal pattern means an opposite surface to the surface contacting the base among the metal patterns. In this case, the surface contacting the base includes a side which substantially contacts the surface and has the base.

Materials of the insulating layers are not particularly limited if the materials are materials which do not conduct electricity, and may use general materials in the art.

For example, the materials of the insulating layers may be independently an insulating polymer. In this case, except for some conductive polymers, since most of the polymers are insulative, the material may use one or more of the insulating polymers or a copolymer thereof. In detail, the material may be one or more of polyimide, polyester, and epoxy resins.

Thicknesses of one or more insulating layers may be independently 5 to 25 μm.

The materials or the thicknesses of one or more insulating layers may be the same as or different from each other.

If metal has conductivity, the metal pattern is not particularly limited, and the metal pattern may be made of one or more metals among metal elements and transition elements in the periodic table, and an oxide or an alloy thereof. For example, the metal pattern may be made of one or more metals among copper and aluminium, and an oxide or an alloy thereof.

In detail, the metal pattern may be a thin film of one selected from a group consisting of copper, iron, nickel, titanium, aluminium, silver, and gold or two or more alloys thereof; or steel use stainless (SUS).

The SUS, which is steel made by adding a large amount of chromium (usually 12% or more) to iron (Fe) so as not to be rusted easily, is alloy steel having a complex component containing small amounts of carbon (C), nickel (Ni), silicon (Si), manganese (Mn), and molybdenum (Mo) if necessary.

The thickness of the metal pattern may be 1 to 40 μm. The first electrode or the second electrode may be electrically connected with an external power source through the metal pattern.

The metal pattern may include a first metal pattern which electrically connects the first electrode and the external power source.

The metal pattern may include a second metal pattern which electrically connects the second electrode and the external power source.

The metal pattern provided at an edge of one side of the base includes a first metal pattern and a second metal pattern, the first metal pattern electrically connects the first electrode and the external power source, the second metal pattern electrically connects the second electrode and the external power source, and the first metal pattern and the second metal pattern are spaced apart from each other to be electrically short-circuited.

A metal plate which is not connected with the metal pattern is included on one side of the base, and the metal plate may be provided on a light emitting area of the organic light emitting part.

A material of the metal plate is not particularly limited, and may be a material which is generally used in the art. For example, the metal plate may be a thin film of one selected from a group consisting of copper, iron, nickel, titanium, aluminium, silver, and gold or two or more alloys thereof; or steel use stainless (SUS).

The size of the metal plate may correspond to the size of the organic light emitting part, or may be larger than the size of the organic light emitting part.

In the exemplary embodiment of this specification, the thickness of the printed circuit board is not particularly limited, but may be 20 µm to 200 µm. In this case, there is an advantage of having a barrier function.

The size of the printed circuit board is not particularly limited if the organic light emitting part is covered with the printed circuit board, but in detail, may be the same as horizontal and vertical lengths of the organic light emitting part or may be larger than the horizontal and vertical lengths of the organic light emitting part by 1 mm to 3 mm. The size is a size suitable to seal the organic light emitting part. In detail, since the printed circuit board is attached to the substrate while covering the upper surface of the organic light emitting part and surrounding the side of the organic light emitting part, the size is the size suitable to seal the organic light emitting part.

When the sealing part may seal the organic light emitting part while covering the outside of the organic light emitting part, the sealing method is not particularly limited.

In the exemplary embodiment of this specification, the sealing part may further include an anisotropic conductive film which bonds the printed circuit board and the substrate to each other.

The organic light emitting diode further includes an anisotropic conductive film provided at an edge of the other side of the base, and the sealing layer may be provided in an area without the anisotropic conductive film on the other side of the base.

In detail, the anisotropic conductive film may be provided at a portion contacting the substrate after the printed circuit board covers the outside of the organic light emitting part, that is, the edge of the printed circuit board.

As illustrated in FIG. 1, the organic light emitting part may be sealed by using the printed circuit board with the sealing layer and the anisotropic conductive film on the substrate with the organic light emitting part as the sealing part. As illustrated in FIG. 2, the organic light emitting part is sealed by the sealing layer, and the printed circuit board may be bonded to the substrate by the anisotropic conductive film.

The anisotropic conductive film is used as a material which conducts electricity by bonding the printed circuit board to the substrate, and the anisotropic conductive film is a double-taped material formed by mixing an adhesive cured by heat and the minute conductive balls therein, and when conductive balls are broken at a portion contacting a pad of a circuit pattern by applying high-temperature pressure, the broken conductive balls carry the current between the pads, and other portions except for the pad portion are bonded to each other when the adhesive is cured. The bonded anisotropic conductive film has conductivity in a thickness direction to conduct electricity, and has an insulating property in a lateral direction.

In this specification, "the edge of the printed circuit board" means a border or an outer portion of one side of the printed circuit board.

On the printed circuit board, a first metal pattern connected with the first electrode of the organic light emitting part; and a second metal pattern connected with the second electrode of the organic light emitting part may be mounted.

In the exemplary embodiment of this specification, the first electrode and the second electrode of the organic light emitting part are extended to a non-organic light emitting part which is a peripheral portion of the organic light emitting part of the substrate, and the first electrode and the second electrode extended to the non-organic light emitting part carry the current in the thickness direction of the anisotropic conductive film by the anisotropic conductive film to be electrically connected to the first metal pattern and the second metal pattern of the printed circuit board, respectively. Further, the first metal pattern and the second metal pattern of the printed circuit board may be connected with a power supply unit, respectively to supply the power to the organic light emitting part.

The organic light emitting diode according to the exemplary embodiment of this specification uses the printed circuit board as a sealant sealing the organic light emitting part, thereby simplifying a structure for sealing of the organic light emitting part and an equipotential of the electrodes.

The organic light emitting diode according to the exemplary embodiment of this specification uses the printed circuit board as a sealant sealing the organic light emitting part, thereby reducing a process for sealing of the organic light emitting part and an equipotential of the electrodes.

The sealing layer is a layer filling a space between the printed circuit board and an outside of the organic light emitting part. In this case, the organic light emitting part may be sealed by filling the space between the printed circuit board and the outside of the organic light emitting part.

A thickness of the sealing layer is not particularly limited, but may be 10 µm to 50 µm. In this case, there is an advantage of minimizing outgasing by the sealing layer. The sealing layer may be a gluing agent or an adhesive including a getter.

In the exemplary embodiment of this specification, the organic light emitting diode is a flexible organic light emitting diode. In this case, the substrate includes a flexible material. For example, glass having a bendable thin film shape, plastic, or a film-shaped substrate may be used.

The organic light emitting diode according to the exemplary embodiment of this specification may be a device including a light extraction structure.

In detail, one or more light-scattering layers may be further included in at least one of between the substrate and the first electrode and a surface facing a surface where the first electrode is provided.

In other words, an internal light-scattering layer may be further included between the substrate provided on the surface facing the surface where the organic material layer of the anode or the cathode is provided and the anode or the cathode. In another embodiment, an external light-scattering layer may be further included on an opposite surface to the surface where the anode or the cathode is provided of the substrate.

In this specification, if the internal light-scattering layer or the external light-scattering layer has a structure that induces light-scattering to improve light extraction efficiency of the device, the internal light-scattering layer or the external light-scattering layer is not particularly limited. In one embodiment, the light-scattering layer may include a structure in which scattering particles are dispersed in a binder, or a protrusion or a lens is provided.

Further, the light-scattering layer may be directly formed on the substrate by a method such as spin coating, bar coating, and slit coating, or formed by a preparing and attaching method in a film form.

In the exemplary embodiment of this specification, a display device including the organic light emitting diode is provided.

In the exemplary embodiment of this specification, an illumination device including the organic light emitting diode is provided.

Another embodiment of this specification provides a method for preparing the organic light emitting diode including: forming an organic emitting part by sequentially laminating a first electrode, an organic material layer, and a second electrode on a substrate; and installing a sealing part covering the outside of the organic emitting part of the substrate, in which the sealing part includes a printed circuit board including a base and a metal pattern formed at an edge of one side of the base, and a sealing layer filling a space between the printed circuit board and the outside of the organic emitting part.

In the exemplary embodiment of this specification, the printed circuit board may be a flexible printed circuit board.

In the exemplary embodiment of this specification, the printed circuit board may include at least one metal pattern.

In the exemplary embodiment of this specification, the printed circuit board may include one or more insulating layers included in at least one of between the base and the metal pattern and on the metal pattern.

In the exemplary embodiment of this specification, in the case where the metal patterns are two or more, the printed circuit board may include an insulating layer included in at least one of between the base and the metal pattern, between the two or more metal patterns, and on the metal pattern.

In the method for preparing the organic light emitting diode, the substrate, the organic light emitting part, the sealing part, and the like are the same as the description of the configuration of the organic light emitting diode.

In the installing of the sealing part, the printed circuit board and the substrate may be bonded to each other by an anisotropic conductive film.

In the installing of the sealing part, the sealing layer may be completely contacted by applying a temperature and pressure.

In this specification, a structure of a printed circuit board which includes a base; a metal pattern provided at an edge of one side of the base; and a sealing layer provided on the other side of the base is provided.

In the exemplary embodiment of this specification, the structure of the printed circuit board may be a flexible printed circuit board.

In the exemplary embodiment of this specification, the structure of the printed circuit board may include at least one metal pattern.

In the exemplary embodiment of this specification, the structure of the printed circuit board may include one or more insulating layers included in at least one of between the base and the metal pattern and on the metal pattern.

In the exemplary embodiment of this specification, in the case where the metal patterns are two or more, the printed circuit board may include an insulating layer included in at least one of between the base and the metal pattern, between the two or more metal patterns, and on the metal pattern.

In the structure of the printed circuit board, the description of the insulating layer, the metal pattern, the sealing layer, and the like are the same as the description of the configurations of the aforementioned organic light emitting diode.

A metal plate which is positioned at the center of one side of the base and is not connected with the metal pattern may be further included.

A material of the metal plate is not particularly limited, and may be a material which is generally used in the art. For example, the metal plate may be a thin film of one selected from a group consisting of copper, iron, nickel, titanium, aluminium, silver, and gold or two or more alloys thereof; or steel use stainless (SUS).

The structure of the printed circuit board may further include a device where a first electrode and a second electrode are included. In detail, the structure of the printed circuit board may be installed on the device where the first electrode and the second electrode are included.

When the structure of the printed circuit board is installed on the device where the first electrode and the second electrode are included, the first electrode or the second electrode may be electrically connected with an external power source through the metal pattern, respectively.

The metal pattern may include a first metal pattern which electrically connects the first electrode and the external power source.

The metal pattern may include a second metal pattern which electrically connects the second electrode and the external power source.

The metal pattern provided at an edge of one side of the base includes a first metal pattern and a second metal pattern, the first metal pattern electrically connects the first electrode and the external power source, the second metal pattern electrically connects the second electrode and the external power source, and the first metal pattern and the second metal pattern are spaced apart from each other to be electrically short-circuited.

While this invention has been described in connection with what is presently considered to be practical exemplary embodiments, it is to be understood that the invention is not limited to the disclosed embodiments, but, is intended to cover various modifications and equivalent arrangements included within the spirit and scope of the appended claims.

The invention claimed is:

1. An organic light emitting device, comprising:
 a substrate;
 an organic light emitting part in which a first electrode, an organic material layer, and a second electrode are sequentially laminated on the substrate; and
 a sealing part covering an outside of the organic light emitting part of the substrate,
 wherein the sealing part includes a printed circuit board including a base and a metal pattern formed at an edge of one side of the base, and a sealing layer filling a space between the printed circuit board and the outside of the organic emitting part,
 wherein the base is formed directly on the sealing layer.

2. The organic light emitting device of claim 1, wherein the printed circuit board includes one or more metal patterns.

3. The organic light emitting device of claim 2, wherein the printed circuit board includes an insulating layer provided on at least one among a location between the base and the metal pattern, between two or more metal patterns, and on the metal pattern.

4. The organic light emitting device of claim 1, wherein the printed circuit board is a flexible printed circuit board.

5. The organic light emitting device of claim 1, wherein the first electrode or the second electrode is electrically connected with an external power source through the metal pattern.

6. The organic light emitting device of claim 5, wherein the metal pattern includes a first metal pattern electrically connecting the first electrode and the external power source.

7. The organic light emitting device of claim 6, wherein the metal pattern includes a second metal pattern electrically connecting the second electrode and the external power source.

8. The organic light emitting device of claim 1, wherein a metal plate which is not connected with the metal pattern is included on one side of the base, and the metal plate is provided on a light emitting area of the organic light emitting part.

9. The organic light emitting device of claim 8, wherein the metal plate is a thin film of one selected from a group consisting of copper, iron, nickel, titanium, aluminum, silver, and gold or two or more alloys thereof; or stainless steel.

10. The organic light emitting device of claim 8, wherein the size of the metal plate corresponds to the size of the organic light emitting part, or is larger than the size of the organic light emitting part.

11. The organic light emitting device of claim 1, wherein the metal pattern provided at the edge of one side of the base includes a first metal pattern and a second metal pattern, the first metal pattern electrically connects the first electrode and an external power source, the second metal pattern electrically connects the second electrode and the external power source, and the first metal pattern and the second metal pattern are spaced apart from each other to be electrically short-circuited.

12. The organic light emitting device of claim 1, wherein the sealing part further includes an anisotropic conductive film which bonds the printed circuit board and the substrate to each other.

13. The organic light emitting device of claim 1, wherein the organic light emitting device further includes an anisotropic conductive film provided at the edge of the one side of the base, and the sealing layer is provided in an area without the anisotropic conductive film on the one side of the base.

14. The organic light emitting device of claim 3, wherein a material of the insulating layer is a polyimide-based resin.

15. The organic light emitting device of claim 1, wherein the metal pattern is a thin film of one selected from a group consisting of copper, iron, nickel, titanium, aluminum, silver, and gold or two or more alloys thereof; or stainless steel.

16. The organic light emitting device of claim 1, wherein the substrate is a glass substrate or a plastic substrate.

17. The organic light emitting device of claim 1, wherein the thickness of the printed circuit board is 20 µm to 200 µm.

18. The organic light emitting device of claim 1, wherein the thickness of the sealing layer is 10 µm to 50 µm.

19. The organic light emitting device of claim 1, wherein the sealing layer is an adhesive including a getter.

20. The organic light emitting device of claim 1, wherein the organic light emitting device is a flexible organic light emitting device.

21. The organic light emitting device of claim 1, wherein one or more light-scattering layers are further included in at least one of between the substrate and the first electrode and a surface facing a surface where the first electrode is provided.

22. A display device including the organic light emitting device according to claim 1.

23. An illumination device including the organic light emitting device according to claim 1.

24. A method for preparing an organic light emitting device, comprising:
forming an organic emitting part by sequentially laminating a first electrode, an organic material layer, and a second electrode on a substrate; and
installing a sealing part covering an outside of the organic emitting part of the substrate,
wherein the sealing part includes a printed circuit board including a base and a metal pattern formed at an edge of one side of the base, and a sealing layer filling a space between the printed circuit board and the outside of the organic emitting part,
wherein the base is formed directly on the sealing layer.

25. The method of claim 24, wherein the printed circuit board includes one or more metal patterns.

26. The method of claim 24, wherein the printed circuit board includes an insulating layer provided on at least one of between the base and the metal pattern, between two or more metal patterns, and on the metal pattern.

27. The method of claim 24, wherein the printed circuit board is a flexible printed circuit board.

28. The method of claim 24, wherein in the installing of the sealing part, the printed circuit board and the substrate are bonded to each other by an anisotropic conductive film.

29. The method of claim 24, wherein the sealing part further includes a metal plate which is positioned at the center of one side of the base and is not connected with the metal pattern.

30. The method of claim 29, wherein the metal plate is a thin film of one selected from a group consisting of copper, iron, nickel, titanium, aluminum, silver, and gold or two or more alloys thereof; or stainless steel.

31. A structure of a printed circuit board, comprising:
a base;
a metal pattern provided at an edge of one side of the base,
a sealing layer provided directly on the base; and
an anisotropic conductive film provided at an edge of the other side of the base,
wherein the sealing layer is provided in an area without the anisotropic conductive film on the other side of the base.

32. The structure of claim 31, wherein the metal pattern includes one or more metal patterns.

33. The structure of claim 32, wherein the printed circuit board includes an insulating layer provided on at least one of between the base and the metal pattern, between two or more metal patterns, and on the metal pattern.

34. The structure of claim 31, wherein the structure of the printed circuit board is a structure of a flexible printed circuit board.

35. The structure of claim 31, further comprising:
a metal plate which is positioned at a center of one side of the base and is not connected with the metal pattern.

36. The structure of claim 35, wherein the metal plate is a thin film of one selected from a group consisting of copper, iron, nickel, titanium, aluminum, silver, and gold or two or more alloys thereof; or stainless steel.

37. The structure of claim 31, wherein the structure of the printed circuit board further includes a device in which a first electrode and a second electrode are included, and the metal pattern includes a first metal pattern which electrically connects the first electrode and an external power source, and a second metal pattern which electrically connects the second electrode and the external power source.

38. The structure of claim 33, wherein a material of the insulating layer is a polyimide-based resin.

39. The structure of claim 31, wherein the metal pattern is a thin film of one selected from a group consisting of copper, iron, nickel, titanium, aluminum, silver, and gold or two or more alloys thereof; or stainless steel.

40. The structure of claim 31, wherein the thickness of the sealing layer is 10 µm to 50 µm.

41. The structure of claim 31, wherein the sealing layer is an adhesive including a getter.

\* \* \* \* \*